United States Patent [19]

Berg et al.

[11] Patent Number: 4,960,490
[45] Date of Patent: Oct. 2, 1990

[54] METHOD OF MAKING MULTIPLE-CONNECTOR ADHESIVE TAPE

[75] Inventors: James G. Berg; Robert S. Reylek, both of St. Paul, Minn.

[73] Assignee: Minnesota Mining and Manufacturing Company, St. Paul, Minn.

[21] Appl. No.: 258,615

[22] Filed: Oct. 17, 1988

Related U.S. Application Data

[60] Division of Ser. No. 7,073,896, Jul. 13, 1987, which is a continuation of Ser. No. 869,250, Jun. 2, 1986, abandoned, which is a continuation of Ser. No. 503,579, Jun. 13, 1983, abandoned.

[51] Int. Cl.$^5$ .......................... B44C 1/22; C23F 1/02
[52] U.S. Cl. ................................ 156/656; 156/659.1; 156/663
[58] Field of Search ............... 428/141, 148, 172, 200, 428/206, 213, 323, 328, 343; 219/543; 174/117 A, 117 F, 117 FF; 156/50, 51, 634, 643, 629, 659.1, 625, 630, 654, 655, 656

[56] References Cited

U.S. PATENT DOCUMENTS

| | | | |
|---|---|---|---|
| 3,215,574 | 11/1965 | Korb | 156/634 |
| 4,038,110 | 2/1977 | Feng | 156/659.1 |
| 4,242,378 | 12/1980 | Arai | 156/634 |
| 4,362,595 | 12/1982 | Skog | 156/634 |

Primary Examiner—Merrell C. Cashion, Jr.
Attorney, Agent, or Firm—Donald M. Sell; Walter N. Kirn; Gerald F. Chenivec

[57] ABSTRACT

Multiple-connector tape has a flexible backing carrying a pattern of longitudinally electrically conductive stripes, each having an overlying adhesive band, each edge of which precisely follows an edge of the underlying conductive stripe. The adhesive bands may contain silver particles having thicknesses exceeding that of the adhesive between particles so that the terminals of an electrical device can be electrically connected through the particles to the longitudinally conductive stripes when the tape is adhered by its adhesive to the device. Electrical connections can be made in the absence of such particles when the stripes are metal foil having embossings which protrude through the adhesive.

15 Claims, 1 Drawing Sheet

METHOD OF MAKING MULTIPLE-CONNECTOR ADHESIVE TAPE

This is a division of application Ser. No. 073,896, which is a continuation of application Ser. No. 869,250, now abandoned, which is a continuation of application Ser. No. 503,579, now abandoned.

FIELD OF THE INVENTION

The invention concerns a multiple-connector adhesive tape for individually connecting a pattern of terminals of one electrical or electronic device to those of another, and is especially intended for use in electronic calculators and computers.

BACKGROUND ART

There is a need in the electronic equipment industry to make convenient and secure electrical connections between an array of electrical terminals and a set of small side-by-side terminal pads, such as the terminal pads of a printed circuit board or a liquid crystal display. A promising technique for making such connections is taught in laid-open United Kingdom patent application No. 2,048,582A, which teaches an adhesive connector tape comprising a flexible nonconductive backing carrying a pattern of longitudinally electrically conductive stripes or conductors, each covered by a band of electrically conductive adhesive. Between each pair of conductors and conductive adhesive bands is an insulative adhesive. FIG. 1 of the U.K. patent application shows the use of a length of the tape for multiple electrical interconnection between two sets of terminal pads, the tape being anchored in position through the combined effect of the adhesive of the electrically conductive adhesive bands and the insulative adhesive between those bands.

The U.K. patent application suggests that the electrically conductive adhesive bands may be a resilient conductive epoxy made commercially available by Micro-Circuit Company of New Buffalo, Michigan. Such an adhesive would afford bonds to glass plate having a shear strength far in excess of 20 kPa, preferably at least 10,000 kPa.

The U.K. patent application teaches that the conductors are applied by silk-screening, brushing, roller coating, spraying or dipping and that the bands of electrically conductive adhesive are applied directly over these conductors. No matter how carefully the adhesive bands are applied, there inevitably is a degree of meander at the edges so that no edge of an adhesive band precisely follows an edge of the underlying conductor.

It is believed that the meander would make it commercially impractical to produce the U.K tape having conductors closer than about 0.5 mm center to center. Even at about 1.0 mn center to center, it would probably be necessary for each adhesive band to be wider than the underlying conductor to assure a sufficient conductivity through the adhesive band at any point along the conductor.

U.S. Pat. No. 4,113,981 (Fujita et al.) uses an adhesive layer for electrically interconnecting two facing arrays of electrical conductors. The adhesive layer includes spherical conductive particles of substantially the same thickness as the adhesive, thus providing a conductive path through each particle that bridges facing pairs of connectors. The particles are randomly distributed throughout the adhesive layer, but the Fujita patent indicates that if the particles comprise less than 30% of the volume of the layer, they will be sufficiently spaced so that the intervening adhesive will insulate against short circuiting between laterally adjacent connectors.

U.S. Pat. No. 3,475,213 (Stow) discloses a pressure-sensitive adhesive tape having an electrically conductive backing and an adhesive layer which contains a monolayer of electrically conductive particles like the adhesive layer of the Fujita patent.

U.S. Pat. No. 3,132,204 (Giellerup) shows an adhesive tape having two conductive paths, which would provide multiple connections.

DISCLOSURE OF THE INVENTION

The multiple-connector tape of the invention, like that of the U.K. patent application, comprises a flexible nonconductive backing carrying a pattern of longitudinally electrically conductive stripes, each covered by a band of adhesive which may contain electrically conductive particles. By "adhesive" is meant a material which affords bonds to glass plate having a shear strength exceeding 20 kPa. The novel multipleconnector tape differs from that of the U.K. patent application in that each edge of each of said adhesive bands precisely follows an edge of the underlying longitudinally electrically conductive stripe, thus permitting the conductive stripes to be very closely spaced. For example, tapes of the invention have been made with electrically conductive stripes at 0.25 mm center to center, and even closer spacing should be commercially feasible. As in the U.K. patent application, the conductive stripes of the pattern may be straight and parallel, or they may have diverse designs as do the conductive paths of various printed circuit boards.

The multiple-connector tape of the present invention is preferably made by the steps of (1) applying a laterally electrically conductive layer onto a flexible electrically nonconductive backing, (2) applying a pattern of adhesive bands onto the electrically conductive layer, and (3) etching away or otherwise removing the electrically conductive layer portions between adjacent adhesive bands to provide a pattern of longitudinally electrically conductive stripes, each edge of which is precisely followed by an edge of the overlying adhesive band.

The adhesive bands of the novel tape may be filled with electrically conductive particles comprising at least 0.1 and preferably not more than 40 volume percent of each adhesive band, at least in those areas where electrical connections are to be made. As taught in U.S. Pat. No. 3,475,213 (Stow), those particles provide electrical conductivity vertically through each adhesive band and may be flattened silver particles. The average minimum thickness of the particles can be somewhat less than or can exceed the thickness of the adhesive between particles, preferably the latter to assure good electrical contact between the underlying electrically conductive stripes and electrical terminals to which the tape may he adhered. When using electrically conductive particles, the average thickness of which is substantially loss than the thickness of the coating, the adhesive bands should include an amount of the particles sufficient to provide conductive chains° extending through each adhesive band.

The aforementioned 3-step method may be followed by a step (4) of applying an unfilled adhesive layer between and over the adhesive bands. This enhances the adhesiveness of the novel multiple-connector tape, especially when the adhesive bands comprise high proportions of electrically conductive particles. Furthermore, an adhesive overlayer electrically insulates particle-filled adhesive bands except where pressure is applied to force the particles through the overlayer to make electrical connections. When there is such an overlayer and the adhesive bands comprise electrically conductive particles, the average minimum thickness of the particles may approximate the total thickness of a particle-filled stripe and the overlying unfilled adhesive layer. When pressure is applied in adhering the tape to electrical terminals, good electrical contact is made through each particle with any excess adhesive flowing into the spaces between the particle-filled adhesive bands, especially when sufficient heat is applied to enhance the flowability of the adhesive.

Instead of being filled, each adhesive band may be unfilled as applied to the backing, and then after Step (3) electrically conductive particles may be applied to the bands of adhesive while they are tacky. For economy, the electrically conductive particles may be applied to the adhesive bands only in areas where an electrical connection is to be made. This provides the additional benefit of insuring against short circuits in areas where no electrical connection is intended. Preferably a thin adhesive overlay is then applied to insure that the particles do not come loose, while insulating areas where no electrical connection is intended.

Another technique for making a multiple-connector adhesive tape of the invention involves the steps of (1) applying to a flexible, electrically nonconductive backing, which transmits actinic or E-beam radiation, a pattern of longitudinally electrically conductive stripes which are opaque to the radiation, (2) coating the full stripe-bearing face of the backing with a viscous monomer composition which is radiation-polymerizable to an adhesive state, (3) exposing the coating to radiation through the backing to polymerize portions of the monomer composition between the radiation-opaque stripes to a substantially tack-free adhesive state, (4) applying electrically conductive particles to the coating to become adhered only to the viscous monomer composition, and (5) exposing the coating to radiation from the coating side to polymerize the balance of the coating to a substantially tack-free adhesive state.

The resulting tape comprises alternating vertically electrically conductive and nonconductive adhesive bands, and each edge of each electrically conductive adhesive band precisely follows an edge of the underlying longitudinally electrically conductive stripe.

A third technique for making a multiple-connector tape of the invention involves the steps of (1) applying a laterally electrically conductive layer onto a flexible electrically nonconductive backing, (2) coating over the entire conductive layer a viscous monomer composition which is radiation-polymerizable to an adhesive state, (3) selectively exposing the coating to radiation to polymerize bands of the coating to a substantially tack-free adhesive state, (4) dissolving or otherwise removing portions of the coating between the polymerized adhesive bands, and (b 5) etching away or otherwise removing the laterally electrically conductive layer between adjacent polymerized bands to provide longitudinally electrically conductive stripes, each edge of which is precisely followed by an edge of the overlying adhesive band.

By including electrically conductive particles in the monomer composition, the adhesive bands may be made vertically electrically conductive.

Because the viscosity of a mixture of polymerizable monomers may be too low to provide desirably thin coatings, the monomers may be partially polymerized to provide a sufficiently viscous monomer composition, e.g., having a coatable viscosity within the range of 1000 to 40,000 cps. Alternatively, a coatable viscosity may be achieved by mixing the monomers with a thixotropic agent such as fumed silica, followed by polymerization in a single in situ step after coating.

The longitudinally electrically conductive strips preferably are metal such as silver or copper and may be formed from broad thin film coatings deposited by vapor deposition, sputtering, or the like. Since it would be time consuming to deposit a film greater than about 100 nm in thickness, thicker coatings are preferably attained by electroplating additional silver or copper onto the deposited thin film. For optimum electrical conductivity, the overall thickness after electroplating is preferably 1-20 micrometers. Instead of depositing and electroplating, a metal foil can be applied to the nonconductive backing.

Preferred flexible nonconductive backings are polyimide film and biaxially-oriented polyethylene terephthalate film, both having good strength, dimensional stability, and age resistance. An aromatic polyimide film such as "Kevlar" is preferred for uses requiring resistance to soldering temperatures. Another useful nonconductive backing is polyvinyl fluoride film ("Tedlar").

Preferably both the adhesive bands and any adhesive overlayer are polymers of alkyl acrylate and/or methacrylate having an average of 1–12 carbon atoms in the alkyl groups. Such a polymer provides better adhesion when it is a copolymer of monomers, up to 50 mol % of which is at least one copolymerizable monomer selected from acrylic acid, methacrylic acid, itaconic acid, maleic acid, maleic anhydride, amides of said acids, and N-vinyl-2-pyrrolidone. The acids should be minimized or avoided when electrical connections are to be made where corrosion might be a problem. Polymers based on alkyl acrylates having an average of 4–12 carbon atoms in their alkyl groups are pressure-sensitive adhesives and may have a weight-averaged $T_g$ in the range from $-20°$ to $-70°$ C. When the average number of carbon atoms is 1—3 or when a polymer is based on an alkyl methacrylate, the copolymer may have a weight-averaged $T_g$ in the range from $-10°$ to $-80°$ C. and be nontacky or poorly tacky at ordinary room temperatures, but become agressively tacky when heated. An adhesive which is nontacky at ordinary room temperatures better holds electrically conductive particles in place after the novel tape has been applied to make electrical connections. Hence, those electrical connections tend to be more secure and more resistant to brief exposure to soldering temperatures. Where such exposure is contemplated, a weight-averaged $T_g$ of from 30° to 80° C. is preferred. However, much the same result can be attained by crosslinking a polymer of lower $T_g$ after the electrical connections have been made, e.g., as taught in U.S. Pat. No. 2,925,174 (Stow).

While alkyl acrylate and methacrylate polymers may be damaged by some chemicals which otherwise would be useful for etching away metal to provide the longitudinally electrically conductive stripes of the novel tape, they are resistant to several efficient etching materials, such as potassium cyanide, ferric chloride and ferric nitrate. Preferably the etching materials should be readily washed away with water, leaving no residue that could otherwise cause either corrosion or electrical short circuits.

DETAILED DESCRIPTION

Figure 1:
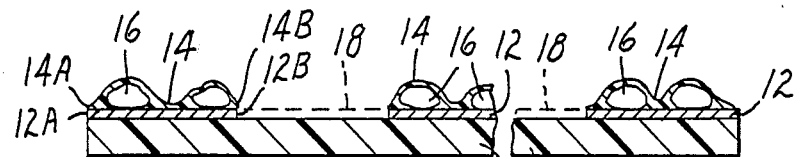
FIG. 1 is a schematic transverse cross-section of a multiple-connector tape of the invention.

The tape shown in FIG. 1 has a flexible nonconductive backing 10 carrying a pattern of longitudinally electrically conductive metal stripes 12. Overlying each of the metal stripes 12 is an adhesive band 14, the edges 14A and 14B of which precisely follow the edges 12A and 12B, respectively, of the metal stripe underlying that hand. Each of the adhesive bands 14 is filled with electrically conductive particles 16, the thicknesses of which slightly exceed the thickness of the adhesive between particles. The areas between the metal stripes 12 have been etched away at 18 as indicated by dotted lines.

Figure 2:
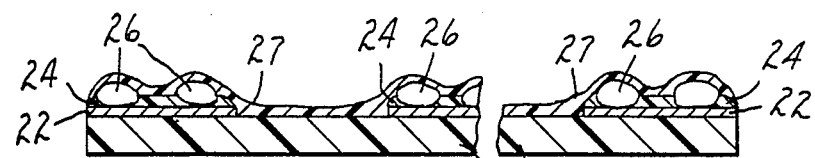
FIG. 2 is a schematic transverse cross-section of another multiple-connector tape of the invention.

The tape of FIG. 2 has a flexible nonconductive backing 20 carrying a pattern of longitudinally electrically conductive metal stripes 22. Overlying each metal stripe 22 is an adhesive band 24 filled with electrically conductive particles 26. The entire face of the tape is covered by an adhesive layer 27. The thicknesses of the particles 26 preferably exceed the total thickness of an adhesive band 24 and overlay 27 between the particles.

Figure 3:
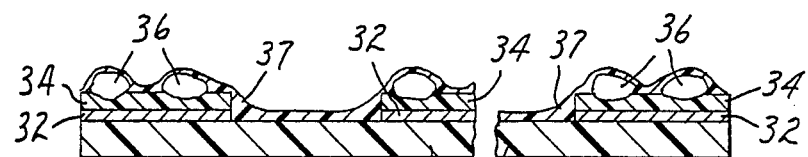
FIG. 3 is a schematic transverse cross section of a third multiple-connector tape of the invention.

The tape of FIG. 3 has a flexible nonconductive backing 30 carrying a pattern of longitudinally electrically conductive stripes 32 and an identical pattern of overlying unfilled adhesive bands 34. Vertically electrically conductive particles 36 have been sprinkled onto the faces of the adhesive bands 34 while they were tacky, and subsequently an unfilled adhesive overlay 37 was applied over the entire pattern.

Figure 4:
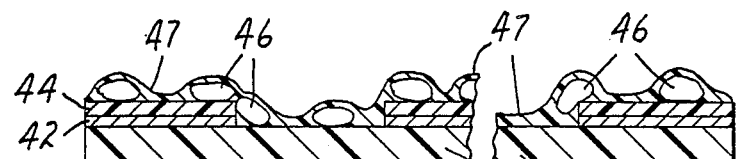
FIG. 4 is a schematic transverse cross section of a fourth multiple-connector tape of the invention.

The tape of FIG. 4 has a flexible nonconductive backing 40 carrying a pattern of longitudinally electrically conductive stripes 42 and an identical pattern of overlying unfilled adhesive bands 44, the edges of which precisely follow the edges of the underlying stripes 42. Over the entire pattern has been applied an adhesive overlay 47 containing widely spaced electrically conductive particles 46 having uniform thicknesses slightly exceeding the total thickness of an adhesive band 44 and overlay 47 between particles. This tape could be applied with each conductive stripe 42 aligned with an electrical terminal and then compressed to connect electrically each terminal and aligned conductive stripe vertically through the particles 46, while the lateral spacing between the particles would assure against short circuiting between adjacent conductive stripes 42.

Figure 5:
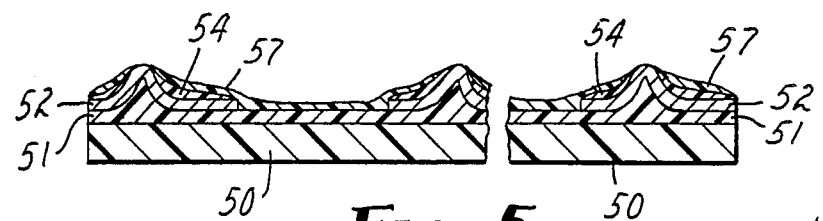
FIG. 5 is a schematic transverse cross section of a fifth multiple-connector tape of the invention.

The tape of FIG. 5 has a flexible nonconductive backing 50 to which an embossed electrically conductive metal foil (see Olyphant 3,497,383) has been bonded by an adhesive layer 51. After applying unfilled bands of adhesive 54 over the metal foil, it has been partially etched away to leave embossed metal stripes 52. Overlying the entire face of the tape is an unfilled adhesive layer 57. The embossings provide electrical conductivity between the metal stripes 52 and electrical terminals to which the tape may be adhered by the adhesive layer 57.

ELECTRICAL RESISTANCE VALUE

A measure of the quality of electrical connections made by multiple-connector tapes of the invention is given by the following test which uses a circuit board having parallel 1.27 mm wide solder-tinned copper lines interrupted by a 25.4 mm gap. Multiple-connector tapes are prepared such that a number of its longitudinally electrically conductive stripes will match the widths of the copper lines. A tape to be tested is cut to a length of 38.1 mm and is bonded by its adhesive to the circuit board to cover about 6.35 mm of each copper line at the gap. While heating the adhesive to its bonding temperature (190° C. for the adhesives of Examples 1–4), a pressure of 200 psi (1380 kPa) is applied for 10 seconds. After cooling, resistance is measured by the 4-probe method, and is reported as the Electrical Resistance Value.

In the following examples all parts are given by weight unless otherwise noted.

EXAMPLE 1

Fine silver spherical particles were sieved with Tyler sieves, and the cut passing 200 mesh (75- micrometer openings) and held on 325 mesh (45-micrometer openings) was selected. These were flattened in a 3-roll paint mill to a maximum thickness of about 40 micrometers. The flattened silver particles were mixed with an adhesive composition based on a copolymer of 40 parts of ethyl acrylate, 56 parts of methyl acrylate, 4 parts of acrylamide and 1 part of gamma-methacryloxypropyl-trimethoxysilane (Union Carbide A-174). The copolymer had a weight-averaged $T_g$ of about 0° C.

| Adhesive Composition | Parts |
| --- | --- |
| Copolymer | 100 |
| Ethyl acetate | 286 |
| Disalicylalpropylene diamine (E. I. duPont "Copper Inhibitor 50") | 2.8 |
| Antioxidant ("Irganox 1010") | 2.4 |
| Flattened silver particles | 29.5 |

Onto a biaxially-oriented polyethylene terephthalate film backing 25 micrometers in thickness was vapor-deposited silver to a thickness of 100 nm, and over the silver the adhesive composition containing flattened silver particles was coated to provide a pattern of parallel adhesive bands each 0.635 mm in width on 1.27 mm centers. After six minutes at 100° C., each dried adhesive band was about 5 micrometers in thickness between particles.

The adhesive-banded face was exposed to a silver etch (American Chemical and Refining Co. ACR-9035 which is understood to be primarily potassium cyanide and to contain minor proportions of potassium hydroxide and a benzoate-type oxidizer) for about one minute, then washed in water and dried for 6 minutes at 100° C. Microscopic examination showed that the vapor-deposited silver had been completely removed between the adhesive bands and that the edges of the remaining stripes of vapor-deposited silver coincided with the edges of the overlying adhesive bands.

The Electrical Resistance Value of this tape was 5 to 10 ohms per channel. When adhered by its adhesive bands to glass plate over an area 0.5 inch (1.27 cm) square at 190° C. for 10 seconds under 200 psi (1380 kPa), the sheare strength at ordinary room temperature exceeded the strength of the polyester film backing, and hence was in excess of 300 kPa.

EXAMPLE 2

The same adhesive composition was used as in Example 1 except that it contained no silver particles. The backing film and its vapor-deposited silver were also the same.

Onto the silver face of the backing were applied a pattern of parallel bands of the adhesive composition 0.125 mm in width on 0.25 mm centers, each about 5 micrometers in dried thickness. The vapor-deposited silver coating between the adhesive bands was removed as in Example 1, and while the bands were still tacky, silver particles mostly spherical in shape and 25-38 micrometers in diameter were sprayed onto the adhesive bands. While a layer of low-adhesion film ("Teflon") covered the adhesive bands, a steel roller having a hard rubber sleeve was repeatedly applied to the film under full arm pressure to press the silver particles into the adhesive bands. After removing the low-adhesion film, a blast of air was applied to insure against any particles remaining in spaces between the adhesive bands. Then over the entire adhesive-banded face was knife-coated the same unfilled adhesive composition to a dried thickness of about 25 micrometers.

Electrical resistance was measured in the same manner as the Electrical Resistance Value except the copper lines were 0.36 mm wide and two adhesive bands contacted each copper line. The average electrical resistance through two conductive stripes was 15 ohms.

EXAMPLE 3

The backing film of this example and its vapordeposited silver were the same as in Examples 1 and 2. Over the vapor-deposited silver was screen-printed the unfilled adhesive composition of Example 2 to provide a pattern of parallel adhesive bands 1.27 mm in width on 2.54 mm centers. Each adhesive band was about 6 micrometers in thickness. The vapor-deposited silver between the adhesive bands was removed by etching as in Example 1.

To the adhesive bands of this tape, one could apply conductive particles as in Example 2.

Screen printing lends itself to the formation of diverse patterns of adhesive bands. A tape such as that of this example could replace either a flexible or a rigid printed circuit board by applying conductive particles to its adhesive bands as in Example 2. By then overcoating the full face of the board as in Example 2, its full face could be electrically insulated until connections are made such as is described in the test for Electrical Resistance Value.

I claim:

1. Method of making a multiple-connector tape comprising the steps of
    (1) applying an electrically conductive layer onto a nonconductive backing,
    (2) applying a pattern of adhesive bands onto the electrically conductive layer, which adhesive affords bonds to glass plate, said adhesive having a shear strength exceeding 20 kPa, and which contain electrically-conductive particles comprising 0.1 to 40 volume percent of each adhesive band, and
    (3) removing the electrically conductive layer portions between adjacent overlying adhesive bands to provide a pattern of longitudinally electrically conductive stripes, each edge of which is precisely followed by an edge of the overlying adhesive band.

2. Method as defined in claim 1 wherein following step (3) there is a step (4) applying an unfilled adhesive layer overlying both the adhesive bands and the backing between said adhesive bands.

3. Method as defined in claim 2 wherein the average minimum thickness of said particles exceeds the total thickness of each particle-filled adhesive band and the overlying unfilled adhesive layer between particles.

4. Method as defined in claim 1 wherein the adhesive bands comprise a polymer of at least one of alkyl acrylate and alkyl methacrylate having an average of 1-12 carbon atoms in the alkyl groups.

5. Method as defined in claim 4 wherein said polymer is a copolymer of monomers, up to 50 mol % which is at least one copolymerizable monomer selected from acrylic acid, methacrylic acid, itaconic acid, maleic acid, maleic anhydride, amides of said acids, and N-vinyl-2-pyrrolidone.

6. Method as defined in claim 4 wherein said polymer is a pressure-sensitive adhesive polymer of alkyl acrylate having an average of 4-12 carbon atoms in its alkyl groups.

7. Method as defined in claim 4 wherein said polymer has a weight-averaged $T_g$ of at least $-10°$.

8. Method of making a multiple-connector tape comprising the steps of
    (1) applying an electrically conductive layer onto a nonconductive backing,
    (2) coating over the entire conductive layer a viscous monomer composition which is radiation-polymerizable to an adhesive state, said monomer composition containing electrically-conductive particles therein,
    (3) selectively exposing the coating to radiation to polymerize bands of the coating to a substantially tack-free adhesive state which affords bonds to glass plate, said adhesive having a shear strength exceeding 20 kPa,
    (4) removing portions of the coating between the polymerized adhesive bands, and
    (5) removing the electrically conductive layer between adjacent polymerized bands to provide longitudinally electrically conductive strips, each edge of which is precisely followed by an edge of the overlying adhesive band.

9. Method of making a multiple-connector tape comprising the steps of
    (1) applying an electrically conductive layer onto a nonconductive backing,
    (2) applying a pattern of adhesive bands onto the electrically conductive layer, which adhesive affords bonds to glass plate, said adhesive having a shear strength exceeding 20 kPa,
    (3) removing the electrically conductive layer portions between adjacent overlying adhesive bands to provide a pattern of longitudinally electrically conductive stripes, each edge of which is precisely followed by an edge of the overlying adhesive band, and (4) applying electrically conductive particles to the surfaces of the adhesive bands while they are tacky.

10. Method as defined in claim 9 including as an additional step (5) applying an unfilled adhesive layer over both the particle-containing adhesive bands and the backing between them.

11. Method as defined in claim 9 wherein the adhesive bands comprise a polymer of at least one of alkyl acrylate and alkyl methacrylate having an average of 1–12 carbon atoms in the alkyl groups.

12. Method as defined in claim 11 wherein said polymer is a copolymer of monomers, up to 50 mol % which is at least one copolymerizable monomer selected from acrylic acid, methacrylic acid, itaconic acid, maleic acid, maleic anhydride, amides of said acids, and N-vinyl pyrrolidone.

13. Method as defined in claim 11 wherein said polymer is a pressure-sensitive adhesive polymer of alkyl acrylate having an average of 4–12 carbon atoms in its alkyl groups.

14. Method as defined in claim 11 wherein said polymer has a weight-averaged $T_g$ of at least $-10$ C.

15. Method of making a multiple-connector tape comprising the steps of (2) applying to an electrically non-conductive backing, which is capable of transmitting E-beam or actinic radiation therethrough, a pattern of longitudinally electrically conductive stripes which are opaque to said radiation, (2) coating the full stripe-bearing face of the backing with a viscous monomer composition which is radiation-polymerizable to an adhesive state, (3) exposing the coating to radiation through the backing to polymerize portions of the monomer composition between the radiation-opaque stripes to a substantially tack-free state, (4) applying electrically conductive particles to the coating to become adhered only to the viscous monomer composition, and (5) exposing the coating to radiation from the coating side to polymerize the balance of the coating to a substantially tack-free adhesive state.

* * * * *